United States Patent [19]

Cook et al.

[11] Patent Number: 5,194,397

[45] Date of Patent: Mar. 16, 1993

[54] METHOD FOR CONTROLLING INTERFACIAL OXIDE AT A POLYCRYSTALLINE/MONOCRYSTALLINE SILICON INTERFACE

[75] Inventors: Robert K. Cook, Poughkeepsie; Ronald W. Knepper, Lagrangeville; Subodh K. Kulkarni, Fishkill; Russell C. Lange, Newburgh; Paul A. Ronsheim, Wappingers Falls; Seshadri Subbanna, Hopewell Junction; Manu J. Tejwani, Yorktown Height; Bob H. Yun, Hopewell Junction, all of N.Y.

[73] Assignee: International Business Machines Corporation, Armonk, N.Y.

[21] Appl. No.: 710,498

[22] Filed: Jun. 5, 1991

[51] Int. Cl.$^5$ .......................................... H01L 21/265
[52] U.S. Cl. .................................. 437/31; 437/233; 437/89; 437/186; 437/939; 437/946; 437/952; 148/DIG. 17; 148/DIG. 124
[58] Field of Search .................... 437/31, 233, 89, 186, 437/939, 946, 952; 148/DIG. 17, DIG. 124

[56] References Cited

FOREIGN PATENT DOCUMENTS 0210820 8/1990 Japan .

OTHER PUBLICATIONS

Crabbé et al.; "Electrical characterization of polysilicon-to -silicon interfaces"; Mat. Res. Soc. Symp. Proc. vol. 106; 198; pp. 247-252.

"Adsorption of Atomic Hydrogen on Clean Cleaved Silicon (111)*", by G. Schulze and M. Henzler, North-Holland Publishing Company, 1983, pp. 336-350.

"The poly-single crystalline silicon interface", by C. Y. Wong, A. E. Michel, and R. D. Isaac, R. H. Kastl and S. R. Mader, J. Appl. Phys., Feb. 15, 1984, pp. 1131-1134.

"Structure and morphology of polycrystalline silicon-single crystal silicon interfaces", John C. Bravman, Gary L. Patton, and James D. Plummer, J. Appl. Phys., Apr. 15, 1985, pp. 2779-2782.

"TEM investigation of the effect of anneal temperature and arsenic concentration on the polysilicon/thin oxide/single-crystal-silicon emitter of a new high-performance bipolar transistor", by N. Jorgensen, et al., Adam Hilger Ltd, 1985, pp. 471-476.

IEEE Transactions On Electron Devices, pp. 1766-1770, "Correlation Between the Diffusive and Electric Barrier Properties of the Interface in Polysilicon Contacted n+-p Junctions", by Johannes M. C. Stork, et al.

"An investigation of the thermal stability of the interfacial oxide in polycrystalline silicon emitter bipolar transistors by comparing device results with high-resolution electron microscopy observations", by G. R. Wolstenholme, et al., J. Appl. Phys., Jan. 1, 1987, pp. 225-233.

(List continued on next page.)

Primary Examiner—Brian E. Hearn
Assistant Examiner—Trung Dang
Attorney, Agent, or Firm—Richard A. Romanchik; Michael J. Balconi-Lamica

[57] ABSTRACT

A method of controlling the interfacial oxygen concentration of a monocrystalline/polycrystalline emitter includes the steps of: passivating the monocrystalline silicon surface by immersing the wafer in a diluted HF acid solution; transferring the wafer into a high vacuum environment; heating the wafer to between 400° and 700° C.; exposing the monocrystalline silicon surface to a gas having a partial pressure of oxygen of between $10^{-5}$ to 1 Torr for between 1 and 100 minutes; and, depositing polysilicon onto the monocrystalline silicon surface.

23 Claims, 6 Drawing Sheets

THE INTERFACIAL OXIDATION DOSE IS PLOTTED AS A FUNCTION OF TIME.

OTHER PUBLICATIONS

"Polycrystalline Silicon Emitter Contacts Formed by Rapid Thermal Annealing", by M. Delfino, et al., J. Electrochem. Soc., Jan. 1, 1989, pp. 215-224.

"Structure and electrical properties of interfaces between silicon films and $n^+$ silicon crystals", Shin-ichi Ogawa, et al., J. Appl. Phys., Jan. 15, 1989, pp. 668-671.

"A photoemission study of passivated silicon surfaces produced by etching in solutions of HF", by J M C Thornton, et al., IOP Publishing Ltd., 1989, pp. 847-851.

IEEE 1990 Bipolar Circuits and Technology Meeting 1.4, pp. 33-36, "Interface Control in Double Diffused Polysilicon Bipolar Transistors", by J. E. Turner, et al.

"kCharacterization of polycrystalline silicon-single-crystal silicon interfaces and correlation to bipolar transistor device data", by Paul A. Ronsheim, et al., J. Appl. Phys., Jan. 1, 1991, pp. 495-498.

"Poly-emitter Device Manufacturing in A Cluster Tool", by Chris J. Werkhoven, et al., Semiconductor International, May 1991, pp. 228-230.

METHOD FOR CONTROLLING INTERFACIAL OXIDE AT A POLYCRYSTALLINE/MONOCRYSTALLINE SILICON INTERFACE

TECHNICAL FIELD

This invention relates to semiconductor manufacturing processes, and more particularly, a method for controlling the concentration of oxygen at polycrystalline/monocrystalline silicon interfaces.

BACKGROUND ART

Polycrystalline silicon (polysilicon) is widely used as a means of making contact to the various structures of bipolar and MOS devices. For example, polysilicon film is utilized in advanced integrated circuit technology as a diffusion source, as an emitter contact in bipolar devices, and as a buried contact in MOS devices. In these instances, the polycrystalline silicon is usually deposited on a monocrystalline silicon substrate. It is widely known that interfacial oxide at the polysilicon/monocrystalline interface strongly affects the electrical characteristics of semiconductor devices resulting therefrom, because the presence of this interfacial oxide affects the transport of dopants and the electrical transport of carriers across the interface. For example, it is known that the presence of an oxide layer at the interface between polycrystalline silicon and the monocrystalline silicon in the emitter of a polysilicon emitter bipolar transistor will diminish the transistor's base current and hence will increase its current gain, beta. (Current gain of bipolar transistors is defined as the ratio of collector current to base current). Suggested explanations for these observations have included reduced emitter band gap narrowing, tunneling transport of electrons and holes across the oxide layer, and minority carrier transport effects on the heavily doped polysilicon layer.

If high gain polysilicon emitter transistors incorporating an interfacial oxide layer are to be used in commercial integrated circuit processes, it is important that the oxide layer be fully characterized in terms of thickness and uniformity and that it is stable during subsequent high temperature processes.

Although there are advantages to having the interfacial oxide layer, there are disadvantages also, including the fact that it increases the transistor emitter resistance, thereby reducing its collector current and consequently the performance of the transistor. It is therefore important to carefully control the interfacial oxide layer if it is to be used effectively. Prior attempts to realize the type of control necessary for effective manufacturing processes have been unsuccessful. For this reason recent disclosures have suggested removing entirely the interfacial oxygen from the interface by utilizing rapid thermal annealing techniques. Example of such disclosure may be found in Turner, et al., "Interface Control in Double Diffused Polysilicon Bipolary Transistors", IEEE 1990 Bipolar Circuits and Technology Meeting 1.4, pg. 33; Delfino, et al., "Polycrystalline Silicon Emitter Contacts Formed by Rapid Thermal Annealing", J. Electrochem. Soc., Vol. 136, No. 1, January 1989, pg. 215; and Bravman, et al., "Structure and Morphology of Polycrystalline Silicon-Single Crystal Silicon Interfaces", J. Appl. Phys. 57(8), Apr. 15, 1985.

Completely removing the interfacial oxygen interface as suggested, though, drastically reduces the current gain, beta, of the transistor. Furthermore, the prior art has not disclosed or taught a method for consistently producing an interface with a desired, constant physical structure as well as devices with desired electrical parameters.

A method for accurately controlling the interfacial oxide layer between polysilicon/monocrystalline silicon interfaces, is therefore, highly desirable.

THE DISCLOSURE OF THE INVENTION

An object of the present invention is to provide a method for accurately controlling the interfacial oxygen concentration at a polysilicon/monocrystalline silicon interface.

Another object of the present invention is to provide a method of forming highly uniform concentrations of interfacial oxygen at polycrystalline silicon/moncrystalline silicon interfaces for multiple devices under process.

Another object of the present invention is to provide for a device having a specific oxygen concentration at a polycrystalline silicon/monocrystalline silicon interface.

In accordance with one aspect of the present invention, a method for controlling interfacial oxygen includes the steps of: precleaning the silicon surface by immersing the wafer in a diluted HF acid solution; transferring the wafer into a high vacuum environment; performing a rapid oxidation to thereby create oxide layers equal to 1 to 20 monolayers of oxygen coverage by elevating the temperature of the wafer to approximately 600° to 650° C. and providing oxygen at a partial pressure of approximately $10^{-5}$ to 1 Torr for about 10 minutes.

In accordance with another aspect of the present invention, a method for controlling interfacial oxygen includes the steps of: precleaning the silicon surface by immersing the wafer in a diluted HF acid solution; rinsing with deionized water; rapidly transferring, under a N$_2$ purge, the wafer into a reaction chamber heated to approximately 535° C.; keeping the wafer at this temperature for about 45 seconds; evacuating the chamber to about 10 mTorr; increasing the chamber temperature to about 620° C.; introducing HCL gas into the chamber; evacuating the chamber again to 10 mTorr; and, depositing polysilicon onto the monocrystalline silicon using silane.

The current gain and emitter resistance of bipolar transistors can be accurately determined using the process of the present invention. The present invention requires equipment which is commonly utilized in the manufacture of semiconductor devices and also requires relatively low temperatures for accomplishing the stated objectives. In addition, it is a fast procedure which facilitates the processing of multiple wafers for each manufacturing "run".

These and other objects, features and advantages of the present invention will become more apparent in light of the detailed description of exemplary embodiments thereof, as illustrated by the drawings.

BEST MODE FOR CARRYING OUT THE INVENTION

Figure 1:
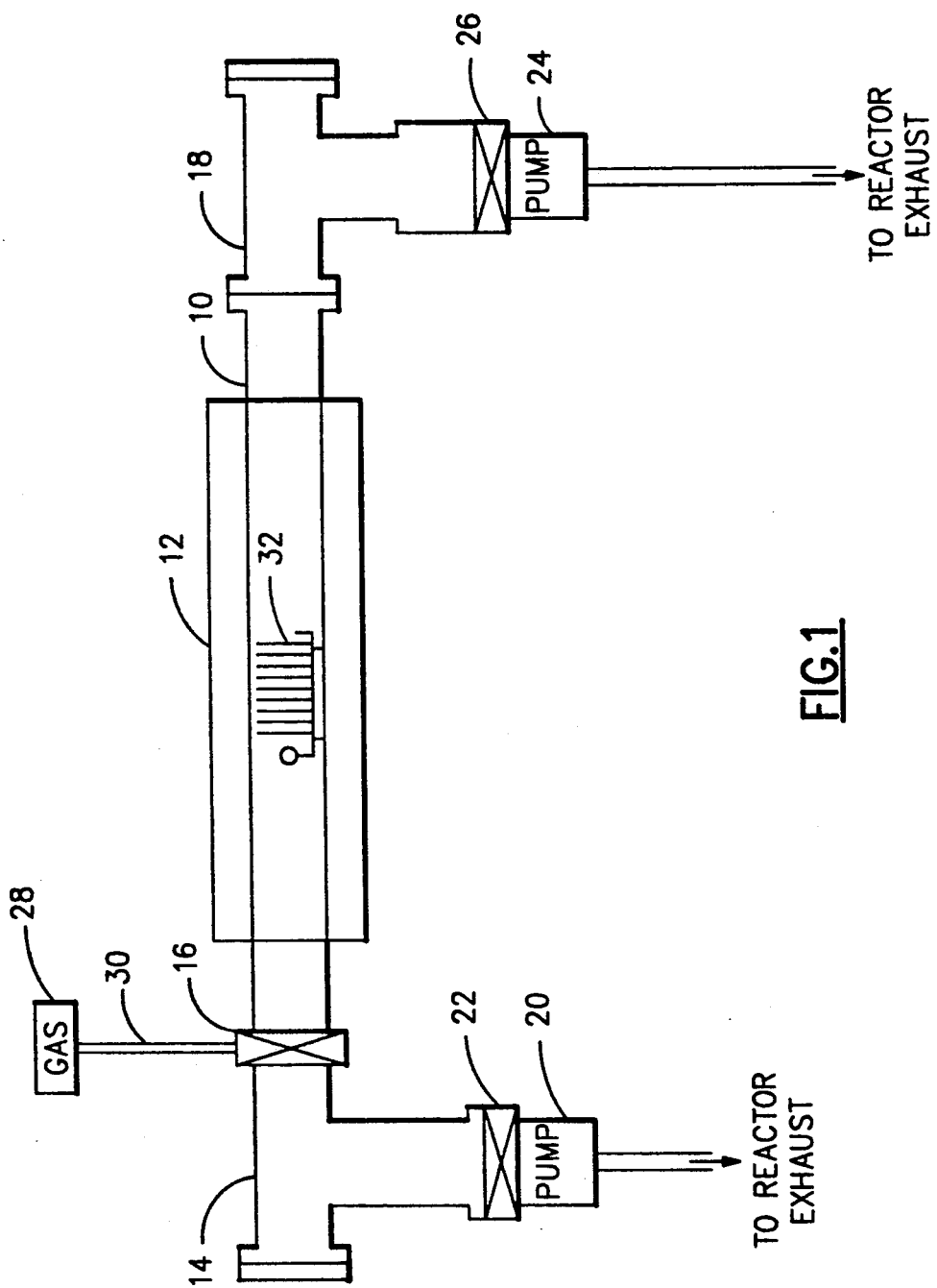
FIG. 1 is a simplified schematic block diagram of the apparatus utilized to facilitate the methods of the present invention.

Referring now to FIG. 1, an apparatus for carrying out the method of the present invention includes a reaction chamber 10, a furnace 12, a load lock chamber 14, a valve 16 for isolating the load/lock chamber 14 from the reaction chamber 10 and a evacuation chamber 18. A pump system 20 evacuates the load/lock chamber 14. A valve 22 isolates the pump 20 from the load/lock chamber 14. A pump 24 draws gas through the reaction chamber 10 and evacuation chamber 18 and a valve 26 isolates the pump 24 from the evacuation chamber 18. Gas is provided from at least one source 28 through a gas line 30 into valve 16 which can direct the gas provided through line 30 into either the reaction chamber 10 or the load/lock chamber 14.

The reaction chamber 10 may be any of a number of conventional Low Pressure Chemical Vapor Deposition (LPCVD) semiconductor processing systems well known in the art. Operation of the system for a first method in accordance with the present invention is as follows.

The wafers 32 having exposed monocrystalline silicon surfaces are immersed in a water diluted 10:1 HF acid solution at room temperature. This step is commonly referred to in the art as "cleaning" or hydrogen passivation because the HF "cleaning" solution removes native oxides existing on the monocrystalline silicon surface and also passivates the surface by yielding a hydrogen terminated, relatively inert silicon surface. Such a hydrogen terminated silicon surface is resistant to oxidation, even on rinsing with water or exposure to air for several hours at room temperature. Consequently, the oxygen concentrations at the silicon surface are maintained much lower than the desired level.

An alternative technique for the aforementioned cleaning step is to expose the wafer to a gaseous mixture of HF and $H_2O$, rather than a water diluted HF solution.

Next, the wafers are rinsed with water and then placed in the load/lock 14. Valve 22 is opened and pump 20 evacuates the load/lock chamber to a pressure of less than 10 mTorr. The purpose of transferring the wafers to the load lock chamber 14 is to inhibit any further oxidation of the monocrystalline silicon surface after the hydrogen passivation by HF cleaning.

Next, the wafers are transferred to the reaction chamber 10, wherein furnace 12 heats the wafers up to a temperature between 400° and 700° C., with the preferred temperature being approximately 620° C. Once the wafers are at the desired temperature, oxygen is provided by gas source 28 through valve 16 and through the reaction chamber 10 at a partial pressure of approximately $1 \times 10^{-5}$ to 1 Torr for between 1 and 100 minutes. Under these conditions, hydrogen desorption and oxidation of the silicon is initiated to thereby create a slightly oxygen deficient silicon dioxide ($SiO_x$) interface surface. It is preferable to achieve 1 to 20 monolayers of this interface, with one monolayer being approximately $7 \times 10^{14}$ atoms/cm² of oxygen. It has been determined that a concentration of interfacial oxygen on the order of $4 \times 10^{15}$ atoms/cm² corresponds to a bipolar transistor current gain of about 100 for a device having an emitter area of approximately $2 \times 2$ um². In the present invention, a device gain of 100 is most desirable. It is to be noted, however, that gain is dependent on many factors not addressed herein, as for example, device impurity profile.

Next, polycrystalline silicon is deposited onto the oxidated monocrystalline silicon surface using a CVD process well known in the art and the structure is ready for further processing.

Still referring to FIG. 1, operation of the system for a second method in accordance with the present invention is as follows.

First, the wafers 32 are immersed in a water diluted 10:1 HF acid solution at room temperature as described hereinbefore for the first method. The wafers are then rinsed using deionized water.

Next, the wafers are loaded into the reaction chamber 10, exposed and heated by the furnace 12 to a temperature approximately 535° C. It is preferable that the wafers be brought to temperature rapidly, more particularly, between 30 and 90 seconds. It is also preferable that the wafers be exposed to a continuous flow of $N_2$ while being heated. The $N_2$ is provided through line 30 from source 28.

Next, the wafers remain heated for between 15 to 300 seconds in order for the monocrystalline surfaces to oxidize in order to achieve the desired concentration of interfacial oxygen. The preferred amount of time is about 45 seconds, with the actual time being dependent upon a number of factors, including the specific reaction chamber utilized and the actual transistor gain desired.

Next, the reaction chamber is evacuated to a pressure of approximately 10 mTorr, and the wafers are heated further to a temperature of about 620° C.

Next, the wafers are exposed to HCL gas at a flow rate of about 60 sccm, which thereby provides a partial pressure of approximately 200 mTorr. It is to be noted that a mixture of HCL gas and air, for instance, in the order of 95% HCL gas and 5% air is also acceptable. It is also to be noted that this step is not essential to the process of the present invention, although it has been found that exposing the wafers to HCL gas at this point provides more consistent results with respect to uniformity and repeatability of desired interfacial oxygen concentrations.

Next, the reaction chamber 10 is evacuated to a partial pressure of about 10 mTorr.

Next, polycrystalline silicon is deposited onto the oxidated monocrystalline silicon surface in a manner well known in the art and the structure is ready for further processing.

It is to be noted that the time between the HF rinse in the second method of the invention described hereinbefore and loading the wafers into the reaction chamber 10 should be minimized in order to minimize uncontrolled oxidation of the monocrystalline silicon. In fact, it is preferable to have a wait time of less than 12 hours.

It is also to be noted that oxidation of wafers occurs in the reaction chamber 10 without the deliberate addition of oxygen into the chamber because typical chambers are not completely air tight. The exact oxidation times, therefore, are dependent upon the particular chamber utilized and the corresponding sealing capability of that chamber. If in fact the chamber is sealed from all ambient air or oxygen, an external source of oxygen must be provided.

It is further to be noted that the load lock chamber 14 is not utilized in the second method described hereinbefore. LPCVD systems which do not have load lock chambers, therefore, may be utilized. These types of systems are well known in the art, and are manufactured by companies such as Tempress, ASM, and Thermco.

Figure 2:
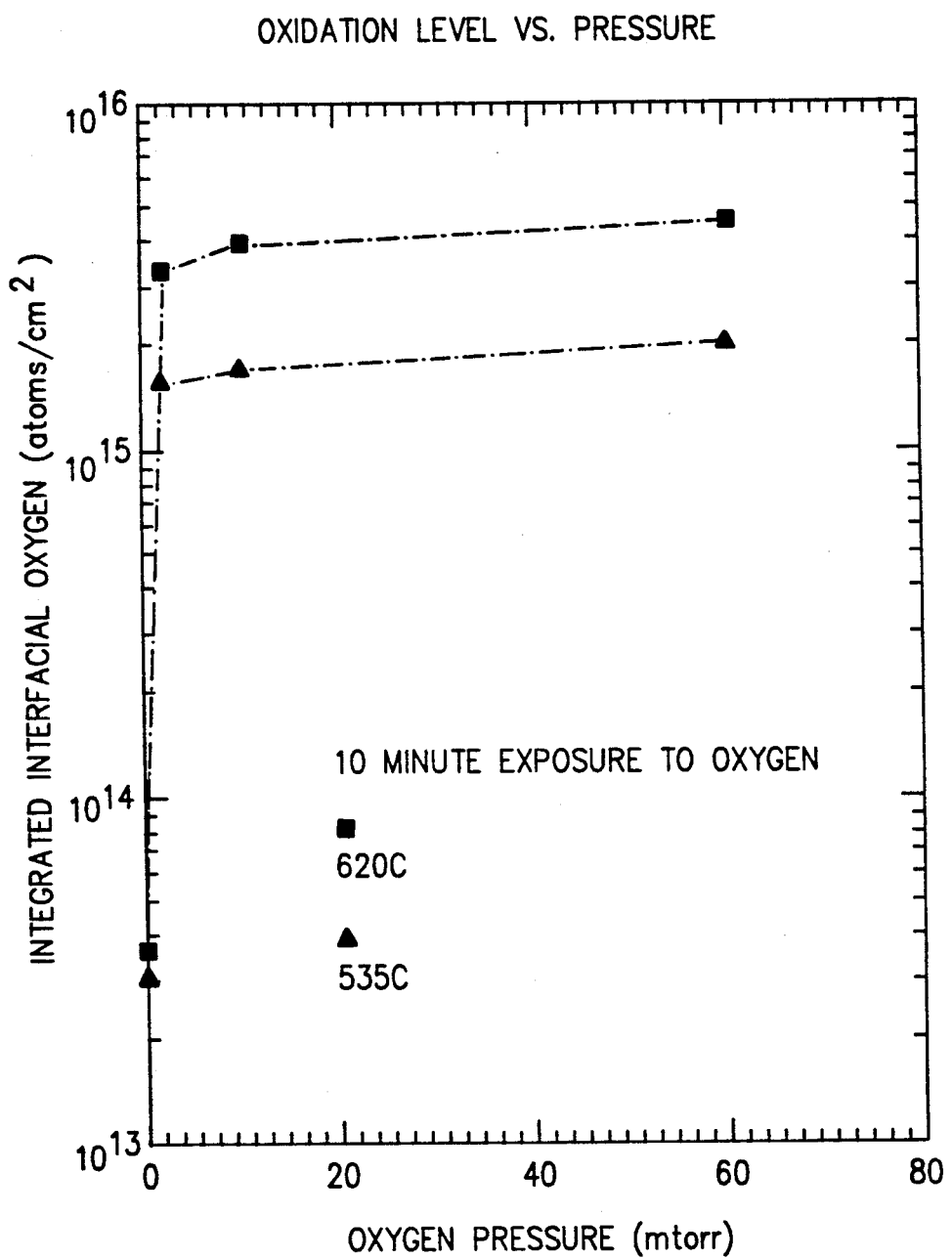
FIG. 2 is a graph illustrating the relationship of oxygen partial pressure to integrated interfacial oxygen resulting from the first method of the present invention.

Referring now to FIG. 2, the relationship of the oxygen partial pressure in the reaction chamber 10 to the concentration of interfacial oxygen for the first method of the present invention is illustrated. It can be seen from the graph of FIG. 2 that the concentration of interfacial oxygen increases relatively slowly as a function of the partial pressure of oxygen in the reaction chamber 10. It is to be noted that this characteristic is similar for different substrate temperatures, as exemplified by the curve for 535° C. and the curve for 620° C.

Figure 3:
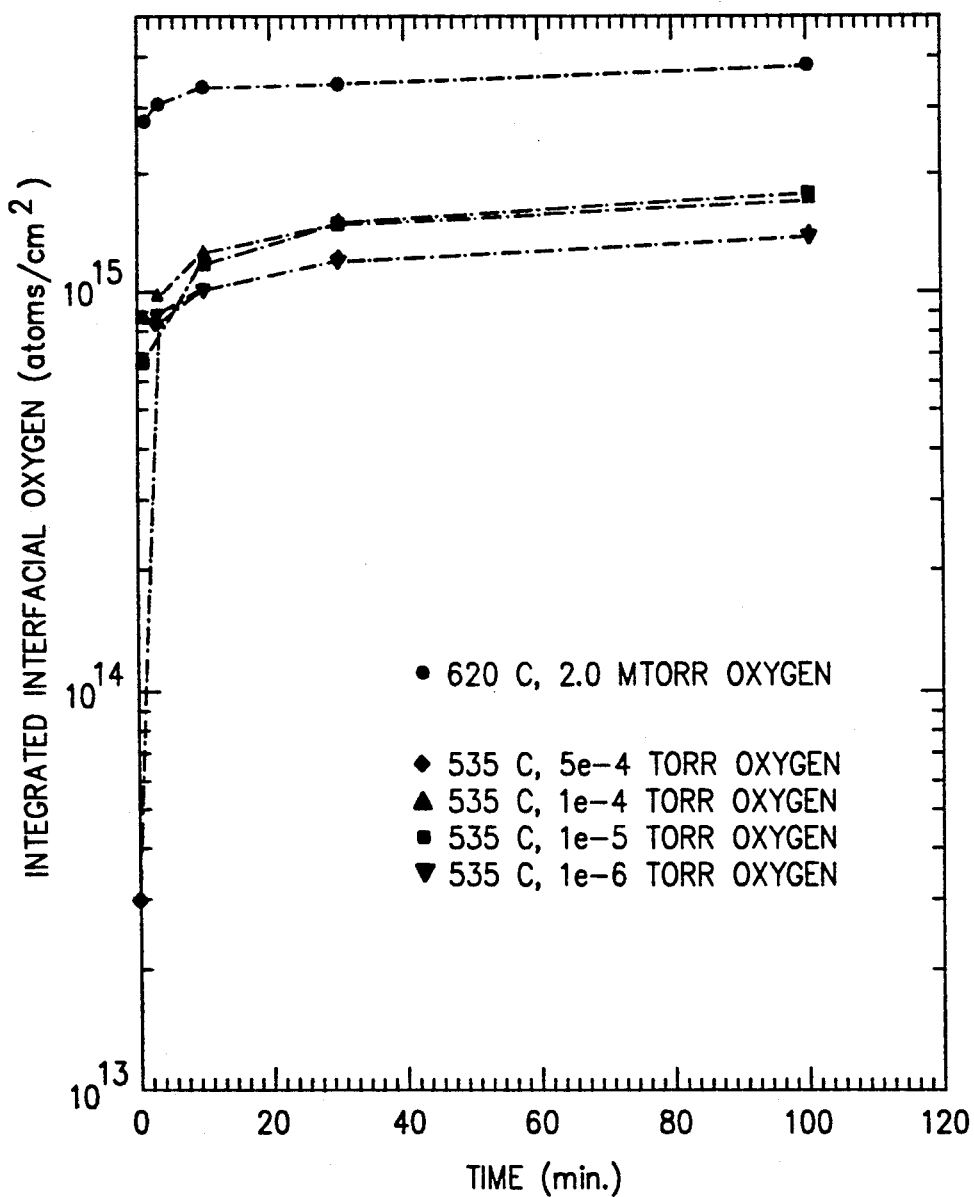
FIG. 3 is a graph illustrating the relationship of time and temperature to integrated interfacial oxygen resulting from the first method of the present invention.

Referring now to FIG. 3, the relationship between time and the concentration of interfacial oxygen for the first method of the present invention is illustrated. It can be seen that the concentration of interfacial oxygen increases relatively slowly after the wafers have been exposed for approximately 10 minutes. It is therefore desirable to expose the wafers in the reaction chamber from 10 to approximately 100 minutes in order to accurately achieve the desired interfacial oxygen concentration. It is to be noted that the relationship between time and interfacial oxygen concentration is similar for different reaction chamber temperatures. As exemplified by the curves for 535° C. and 620° C.

Figure 4:
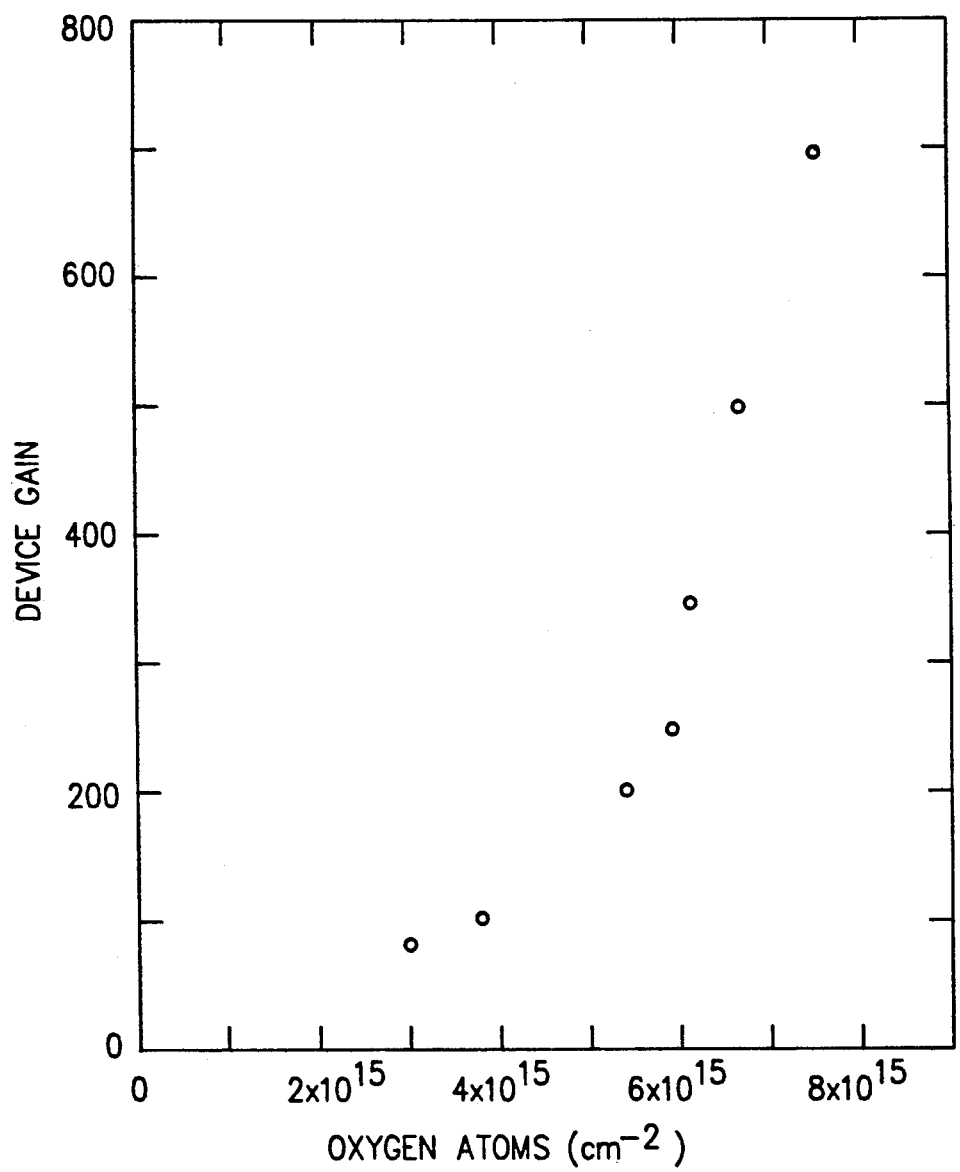
FIG. 4 is a graph illustrating the gain of a bipolar transistor to the concentration of interfacial oxygen resulting from the methods of the present invention.

Referring now to FIG. 4, the relationship between bipolar device gain, beta, and the concentration of interfacial oxygen for transistors made in accordance with the methods of the present invention is illustrated. It can be seen that device gain increases somewhat linearly with increases in the concentration of interfacial oxygen. It is to be noted that a desired device gain of 100 corresponds to an interfacial oxygen concentration of approximately $4 \times 10^{15}/cm^2$.

Figure 5:
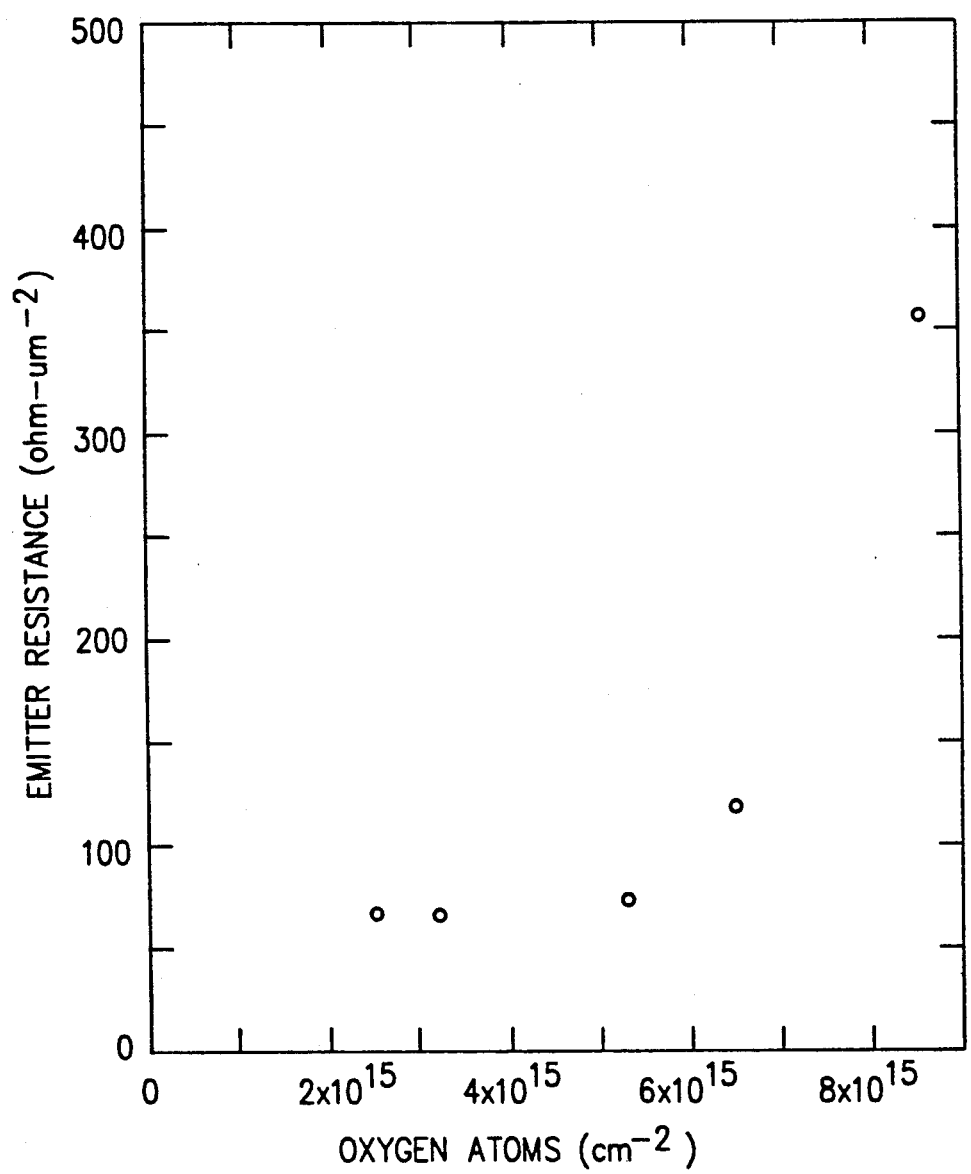
FIG. 5 is a graph illustrating the relationship of emitter resistance to the concentration of interfacial oxygen resulting from the methods of the present invention.

Referring now to FIG. 5, the relationship of bipolar transistor emitter resistance (Re) to the concentration of interfacial oxygen for transistors made in accordance with the methods of the present invention is illustrated. It can be seen that the emitter resistance rises dramatically for interfacial oxygen concentrations greater than approximately $7 \times 10^{15}/cm^2$. Consequently, in practice, it is the emitter resistance Re which limits the useful gain of the bipolar transistor derived from the process of the present invention, since it is frequently Re which limits the transistor performance.

The gain of bipolar devices derived from the methods of the present invention is adjustable by varying the concentration of interfacial oxygen, with the gain being limited by the amount of emitter resistance which is tolerable. A typical design sequence for designing bipolar transistor in accordance with the first method of the present invention would be first the determination of the desirable device gain. For example, a desirable device gain might be on the order of 300. The graph of FIG. 4 would then be used to determine the necessary concentration of interfacial oxygen. For this example, the necessary concentration would be approximately $6.0 \times 10^{15}/cm^2$–$6.2 \times 10^{15}/cm^2$. Next, this concentration of interfacial oxygen would be correlated with the consequential emitter resistance by translating that interfacial oxygen concentration to emitter resistance utilizing the graph of FIG. 5. For this example, it can be seen that interfacial oxygen concentrations of $6.0 \times 10^{15}/cm^2$–$6.2 \times 10^{15}/cm^2$ translate to an emitter resistances of approximately 100–120 ohms-um$^2$. This value of emitter resistance, however, might be considered too high for practical use. Also, it can be seen that small changes in interfacial oxygen in this area of the curve or schedule corresponds to large changes in the emitter resistance. Consequently, manufacturing devices consistently with these specific characteristics would be very difficult. Therefore, a lower gain device must be utilized in order to bring the emitter resistance to lower values and more stable conditions. In the present invention a device gain of approximately 100 is preferred. As can be seen by FIG. 4, a gain of 100 requires an interfacial oxygen concentration of approximately $4 \times 10^{15}/cm^2$ which then translates in FIG. 5 to an emitter resistance of approximately 70 ohms-um$^2$.

It is to be understood that the aforementioned sequence may be utilized for a variety of bipolar devices having different device gains.

It is to be noted that the precise condition for a given interfacial oxygen concentration at the polysilicon/monocrystalline silicon interface derived from the process of the present invention is dependent upon a particular reaction chamber utilized. The aforementioned process and data was derived from a UHV/CVD tool which provides a base pressure on the order of $1 \times 10^{-9}$ Torr. The parameters (partial pressure of oxygen and temperature) might very well be different for other tools. For instance, the following table describes the relationships of temperature, time and partial pressure of oxygen to the resultant interfacial oxygen concentration for wafers processed in an AME Precision 5000 machine, manufactured by Applied Materials, Inc.

TABLE 1

| Run | Surface | Treatment | Detail | Oxygen Con. |
|---|---|---|---|---|
| 1 | O$_2$: 430° C., | 5 Min., | 10 Torr | 3.0 × 10$^{15}$ |
| 2 | O$_2$: 430° C., | 10 Min., | 10 Torr | 3.0 × 10$^{15}$ |
| 3 | O$_2$: 430° C., | 15 min., | 10 Torr | 3.2 × 10$^{15}$ |
| 4 | O$_2$: 430° C., | 10 min., | 8 Torr | 2.6 × 10$^{15}$ |
| 5 | O$_2$: 430° C., | 10 min., | 12 Torr | 3.3 × 10$^{15}$ |
| 6 | O$_2$: 410° C., | 10 min., | 10 Torr | 2.4 × 10$^{15}$ |

As can be seen, the ideal partial pressure of oxygen for the AME 5000 machine is between 8 and 12 Torr whereas the partial pressure of oxygen for the aforementioned UHV/CVD machine was less than 1 Torr. However, the relationships between the interfacial oxygen concentration and device parameters resultant therefrom would be the same as that illustrated in aforementioned FIG. 3–6. Different parameters must therefore be dialed into the individual device or manufacturing apparatus utilized in order to achieve the proper interfacial oxygen concentrations.

Figure 6:
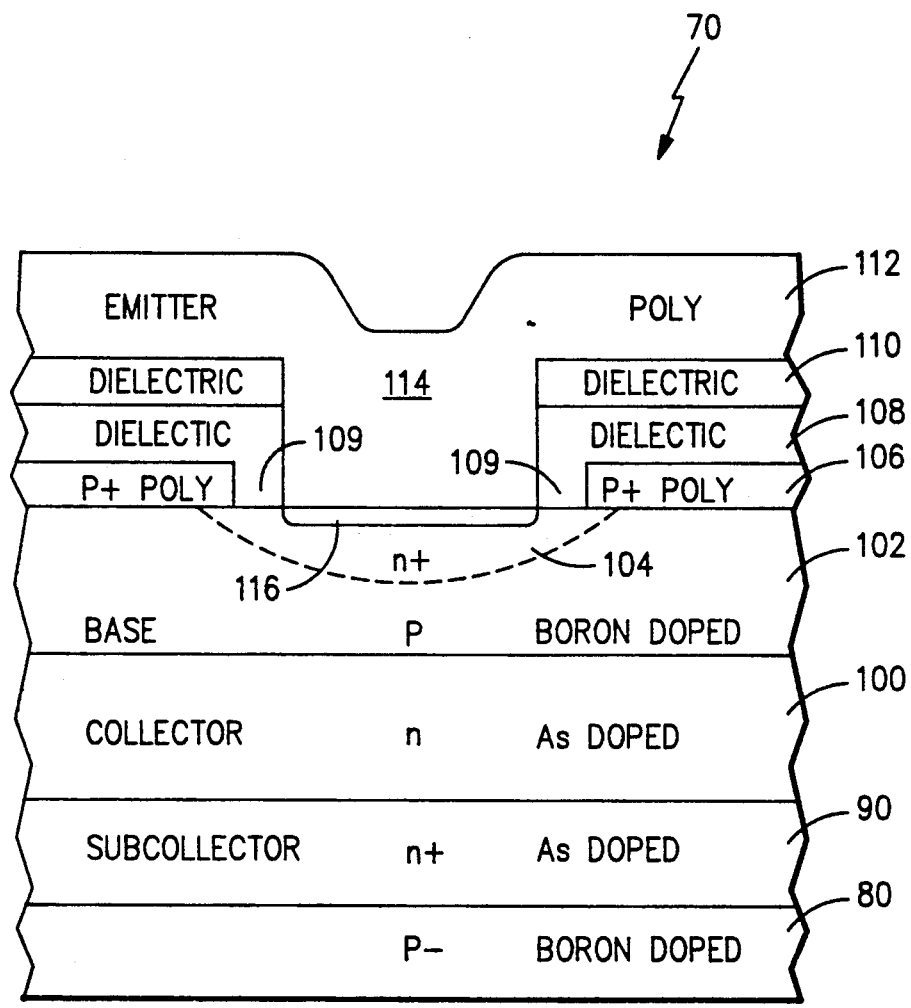
FIG. 6 is a simplified cross-sectional view of a NPN bipolar transistor manufactured in accordance with methods of the present invention.

Referring now to FIG. 6, a NPN bipolar transistor 70 made in accordance with the methods of the present invention comprises: a P− doped substrate 80; a N+ doped monocrystalline subcollector 90; a N doped monocrystalline silicon collector; a P doped base 102; a P+ doped polysilicon contact layer 106; and, insulating layers 108, 110. A hole 114 is then etched through the insulating layers 108 and 110 and the contact layer 106. A partial reoxidation of contact layer 106 is then done to form an insulation layer 109 between the P+ polysilicon of contact layer 106 and hole 114. The surface of layer 102 which is exposed at the bottom of hole 114 is then oxidized according to the methods of the present invention to thereby form an interface layer 116 of silicon having a specific concentration of oxygen as described herein before. A layer of polycrystalline silicon 112 is then deposited in hole 114, implanted with N dopant (e.g. Arsenic) and annealed to thereby form the emitter, which is comprised of area 104, $SiO_x$ interface 116 and polysilicon 112. The lack of control in the art over the interface 116 caused great uncertainties in the values of gain and emitter resistance of the resultant transistors. In the method of the present invention, the formation of the interfacial oxide interface 116 is carefully controlled by transferring the wafer into evacuated load lock 14 (FIG. 1) after the wafer has been hydrogen passivated in the HF solution. The interfacial oxide interface 116 is then created by providing a specific partial pressure of oxygen in a reaction chamber at a specific reaction temperature, followed by deposition of a polysilicon 112 overlay, as described hereinbefore.

It is to be noted that a similar manufacturing process and device derived therefrom may be made applicable for other types of devices not previously mentioned, including PNP bipolar transistors.

Although the invention has been shown and described with exemplary embodiments thereof, it should be understood by those skilled in the art that the foregoing and various other changes, omissions and additions may be made therein and thereto without departing from the spirit and scope of the invention.

We claim:

1. A method of forming a bipolar transistor with a predetermined gain and having a low resistance, polycrystalline/monocrystalline silicon emitter contact interface, comprising the steps of:
    a) determining a first concentration of interfacial oxygen at the polycrystalline/monocrystalline silicon interface necessary to provide the specified gain according to a predetermined schedule correlating transistor gain to the concentration of interfacial oxygen at the polycrystalline/monocrystalline silicon interface;
    b) passivating the monocrystalline silicon with hydrogen;
    c) heating the monocrystalline silicon to a predetermined temperature;
    d) exposing the monocrystalline silicon for a predetermined length of time to a gas having a predetermined partial pressure of oxygen in order to oxidize a portion of the monocrystalline silicon in order to provide said first concentration of interfacial oxygen at the polycrystalline/monocrystalline silicon interface in accordance with said predetermined schedule; and,
    e) depositing polycrystalline silicon onto the monocrystalline silicon,
    wherein said first concentration of interfacial oxygen yields a specific emitter contact resistance of less than 100 ohms-um².

2. A method of forming a bipolar transistor with a specified gain and having a low resistance, polycrystalline/monocrystalline silicon emitter according to claim 1, wherein step b) comprises immersing the substrate in a first solution comprised of HF.

3. A method of forming a bipolar transistor with a specified gain and having a low resistance, polycrystalline/monocrystalline silicon emitter according to claim 2, wherein step b) comprises immersing the substrate in a first solution comprised of dilute 10:1 HF.

4. A method of forming a bipolar transistor with a specified gain and having a low resistance, polycrystalline/monocrystalline silicon emitter according to claim 1, wherein said predetermined temperature is between 400 and 700 degrees centigrade.

5. A method of forming a bipolar transistor with a specified gain and having a low resistance, polycrystalline/monocrystalline silicon emitter according to claim 1, wherein said predetermined amount of time is between 1 and 100 minutes.

6. A method of forming a bipolar transistor with a specified gain and having a low resistance, polycrystalline/monocrystalline silicon emitter according to claim 1, wherein said predetermined partial pressure is between $1 \times 10^{-5}$ and 1 Torr.

7. A method of forming a bipolar transistor with a specified gain and having a low resistance, polycrystalline/monocrystalline silicon emitter according to claim 1, after step b) further comprising the step of:
    substantially evacuating the atmosphere surrounding the substrate in order to inhibit oxidation of the substrate.

8. A method of forming a device onto a monocrystalline silicon substrate comprising the steps of:
    a) passivating the monocrystalline silicon with hydrogen;
    b) heating the substrate to a first specified temperature;
    c) keeping the substrate at said first specified temperature for a specified length of time in order to oxidize a portion of the substrate, wherein said specified amount of time is between 15 and 300 seconds;
    d) evacuating the atmosphere around the substrate to a specified partial pressure;
    e) heating the substrate to a second specified temperature; and,
    f) depositing polycrystalline silicon onto the substrate.

9. A method of forming a device onto a monocrystalline silicon substrate comprising the steps of:
    a) passivating the monocrystalline silicon with hydrogen;
    b) heating the substrate to a first specified temperature, wherein said heating takes between 30 and 90 seconds;
    c) keeping the substrate at said first specified temperature for a specified length of time in order to oxidize a portion of the substrate;
    d) evacuating the atmosphere around the substrate to a specified partial pressure;
    e) heating the substrate to a second specified temperature; and,
    f) depositing polycrystalline silicon onto the substrate.

10. A method of forming a device onto a monocrystalline silicon substrate comprising the steps of:
    a) passivating the monocrystalline silicon by immersing the substrate in a first solution comprised of 10:1 dilute HF;

b) heating, the substrate to a temperature on the order of 535 degrees centigrade, wherein said heating takes between 30 and 90 seconds;

c) keeping the substrate at said temperature for on the order of 45 seconds in order to oxidize a portion of the substrate;

d) evacuating the atmosphere around the substrate to a partial pressure on the order of 10 mTorr;

e) heating the substrate to a temperature on the order of 620 degrees centigrade; and, f) depositing polycrystalline silicon onto the substrate.

11. A method of forming a device onto a monocrystalline silicon substrate according to claim 10, wherein the time between steps a) and b) is less than 12 hours.

12. A method of forming a device onto a monocrystalline silicon substrate comprising the steps of:

a) passivating the monocrystalline silicon with hydrogen;

b) heating the substrate to a first specified temperature;

c) keeping the substrate at said predetermined temperature for a predetermined length of time in order to oxidize a portion of the substrate;

d) evacuating the atmosphere around the substrate to a first predetermined partial pressure;

e) heating the substrate to a second predetermined temperature;

f) exposing the substrate to HCL gas;

g) evacuating the atmosphere around the substrate to a second predetermined partial pressure; and, g) depositing polycrystalline silicon onto the substrate.

13. A method of forming a device onto a monocrystalline silicon substrate according to claim 12, wherein step a) comprises immersing the substrate in a first solution comprised of HF.

14. A method of forming a device onto a monocrystalline silicon substrate according to claim 12, wherein step a) comprises immersing the substrate in a first solution comprised of 10:1 dilute HF.

15. A method of forming a device onto a monocrystalline silicon substrate according to claim 12, wherein said first, specified temperature is on the order of 535 degrees centigrade.

16. A method of forming a device onto a monocrystalline silicon substrate according to claim 12, wherein said specified amount of time is on the order of 45 seconds.

17. A method of forming a device onto a monocrystalline silicon substrate according to claim 12, wherein said specified partial pressure is on the order of 10 mTorr.

18. A method of forming a device onto a monocrystalline silicon substrate according to claim 12, wherein said first and second specified partial pressures are on the order of 10 mTorr.

19. A method of forming a device onto a monocrystalline silicon substrate according to claim 12, wherein the time between steps a) and b) is less than 12 hours.

20. A method of forming a device onto a monocrystalline silicon substrate according to claim 12, wherein step b) takes between 30 and 90 seconds.

21. A method of forming a device onto a monocrystalline silicon substrate according to claim 12, wherein said second specified temperature is on the order of 620 degrees centigrade.

22. A method of forming a device onto a monocrystalline silicon substrate comprising the steps of:

a) passivating the monocrystalline silicon by immersing the substrate in a first solution comprised of 10:1 dilute HF;

b) heating, the substrate to a temperature on the order of 535 degrees centigrade, over a period of between 30 and 90 seconds;

c) keeping the substrate at said temperature for on the order of 45 seconds in order to oxidize a portion of the substrate;

d) evacuating the atmosphere around the substrate to a partial pressure on the order of 10 mTorr;

e) heating, the substrate to a temperature on the order of 620 degrees centigrade;

f) exposing the substrate to a HCL gas;

g) evacuating the atmosphere around the substrate to on the order of 10 mTorr; and, h) depositing polycrystalline silicon onto the substrate.

23. A method of forming a bipolar transistor with a specified gain and having a low resistance, polycrystalline/monocrystalline silicon emitter contact interface, comprising the steps of:

a) determining a first concentration of interfacial oxygen at the polycrystalline/monocrystalline silicon interface necessary to provide: 1) the specified gain according to a specified schedule correlating transistor gain to the concentration of interfacial oxygen at the polycrystalline/monocrystalline silicon interface and 2) an emitter contact resistance of less than 100 ohms-um$^2$ according to a specified schedule correlating emitter contact resistance to the concentration of interfacial oxygen at the polycrystalline/monocrystalline silicon interface;

b) passivating the monocrystalline silicon with hydrogen;

c) heating the monocrystalline silicon to a specified temperature;

d) exposing the monocrystalline silicon for a specified length of time to a gas having a specified partial pressure of oxygen in order to oxidize a portion of the monocrystalline silicon in order to provide said first concentration of interfacial oxygen at the polycrystalline/monocrystallie silicon interface in accordance with said specified schedules; and, e) depositing polycrystalline silicon onto the monocrystalline silicon.

* * * * *